(12) United States Patent
Li et al.

(10) Patent No.: US 11,903,262 B2
(45) Date of Patent: Feb. 13, 2024

(54) DISPLAY PANEL, METHOD FOR MANUFACTURING SAME, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Bejing (CN)

(72) Inventors: Wei Li, Beijing (CN); Bin Zhou, Beijing (CN); Shengping Du, Beijing (CN); Qinghua Guo, Beijing (CN); Tao Sun, Beijing (CN); Wei Song, Beijing (CN); Liangchen Yan, Beijing (CN)

(73) Assignees: HEFEI XINSHENG OPTOELECTRONICS TECHNOLOGY CO., LTD, Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 72 days.

(21) Appl. No.: 17/342,596

(22) Filed: Jun. 9, 2021

(65) Prior Publication Data

US 2021/0408183 A1    Dec. 30, 2021

(30) Foreign Application Priority Data

Jun. 30, 2020    (CN) .......................... 202010623014.4

(51) Int. Cl.
*H10K 59/122*    (2023.01)
*H10K 71/00*    (2023.01)

(52) U.S. Cl.
CPC ........... *H10K 59/122* (2023.02); *H10K 71/00* (2023.02)

(58) Field of Classification Search
CPC .......................... H01L 27/3246; H01L 51/56
(Continued)

(56) References Cited

U.S. PATENT DOCUMENTS

2014/0091285 A1\* 4/2014 Shin .................... H01L 51/5012
                                                    438/34
2014/0197396 A1\* 7/2014 Madigan ............. H01L 51/5234
                                                    438/34
(Continued)

FOREIGN PATENT DOCUMENTS

CN          105404038 A        3/2016
CN          205542786 U        8/2016
(Continued)

OTHER PUBLICATIONS

China National Intellectual Property Administration, First office action of Chinese application No. 202010623014.4 dated Aug. 3, 2022, which is foreign counterpart application of this US application.

*Primary Examiner* — Dzung Tran
(74) *Attorney, Agent, or Firm* — Lippes Mathias LLP

(57) ABSTRACT

A display panel includes a substrate, and a pixel defining layer and a cathode layer that are laminated on the substrate. The pixel defining layer includes a plurality of strip-shaped first pixel defining structures and a plurality of strip-shaped second pixel defining structures. A slope angle of the second pixel defining structure is greater than a slope angle of the first pixel defining structure, and the second pixel defining structure is configured to separate portions of the cathode layer on two sides of the second pixel defining structure.

12 Claims, 6 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2015/0123084 A1* | 5/2015 | Kim .................... | H01L 27/3276 257/43 |
| 2017/0069697 A1* | 3/2017 | Hashimoto .......... | H10K 59/122 |
| 2017/0141169 A1* | 5/2017 | Sim ..................... | H01L 27/3258 |
| 2018/0286934 A1* | 10/2018 | Zhao ................... | H01L 51/0005 |
| 2018/0342563 A1* | 11/2018 | You ..................... | H01L 27/3246 |
| 2020/0201393 A1* | 6/2020 | Ahn ........................ | G09F 9/301 |

FOREIGN PATENT DOCUMENTS

| | | |
|---|---|---|
| CN | 106920828 A | 7/2017 |
| CN | 108110035 A | 6/2018 |
| CN | 108565347 A | 9/2018 |

\* cited by examiner

(12) United States Patent

DISPLAY PANEL, METHOD FOR MANUFACTURING SAME, AND DISPLAY DEVICE

CROSS REFERENCE TO RELATED APPLICATION

This application claims priority to the Chinese Patent Application No. 202010623014.4, filed on Jun. 30, 2020 and entitled "DISPLAY PANEL, METHOD FOR MANUFACTURING SAME, AND DISPLAY DEVICE", which is incorporated herein by reference in its entirety.

TECHNICAL FIELD

The present disclosure relates to the field of displays, and in particular to a display panel, a method for manufacturing the same, and a display device.

BACKGROUND

At present, organic light-emitting diode (OLED) displays have received wide attention, due to advantages of light weight, small thickness, wide viewing angle, active light emission, fast response speed, low energy consumption, low drive voltage, high light-emitting efficiency, flexible display and the like.

SUMMARY

The present disclosure provides a display panel, a method for manufacturing the same, and a display device. The technical solutions are as follows.

In an aspect, a display panel is provided. The display panel includes a substrate and a pixel defining layer and a cathode layer that are laminated on the substrate, wherein the pixel defining layer includes a plurality of strip-shaped first pixel defining structures and a plurality of strip-shaped second pixel defining structures, and the plurality of first pixel defining structures and the plurality of second pixel defining structures are configured to define a plurality of sub-pixel regions arranged in an array on the substrate; and a slope angle of the second pixel defining structure is greater than a slope angle of the first pixel defining structure, and the second pixel defining structure is configured to separate portions of the cathode layer on two sides of the second pixel defining structure.

Optionally, the slope angle of the second pixel defining structure ranges from 90 degrees to 100 degrees.

Optionally, a shape of a cross section of the second pixel defining structure is at least one of an inverted trapezoid and an inverted circular trapezoid.

Optionally, the second pixel defining structure is a structure formed by performing a one-time patterning process on a non-photosensitive material.

Optionally, the non-photosensitive material includes organic silicone resin.

Optionally, a portion of the cathode layer between two adjacent second pixel defining structures is of a continuous strip-shaped structure.

Optionally, the slope angle of the first pixel defining structure ranges from 20 degrees to 60 degrees.

Optionally, a shape of a cross section of the first pixel defining structure is a bow.

Optionally, the first pixel defining structure is a structure formed by performing exposure and development on a photosensitive material.

Optionally, the photosensitive material includes at least one of an acrylic material or a polyimide material.

Optionally, the display panel includes sub-pixels of at least two colors, wherein sub-pixels in sub-pixel regions between two adjacent second pixel defining structures are of the same color, and sub-pixels in any two adjacent sub-pixel regions between two adjacent first pixel defining structures are of different colors.

Optionally, the display panel further includes a light-emitting layer disposed between the pixel defining layer and the cathode layer, and the second pixel defining structure is further configured to separate portions of the light-emitting layer on two sides of the second pixel defining structure.

Optionally, a portion of the light-emitting layer between two adjacent second pixel defining structures is of a continuous strip-shaped structure.

Optionally, the display panel further includes a plurality of anode blocks disposed between the pixel defining layer and the substrate, wherein the plurality of anode blocks are in one-to-one correspondence with the plurality of sub-pixel regions, a central part of the anode block is disposed in a corresponding sub-pixel region, and an edge part of the anode block is covered by the pixel defining layer.

Optionally, the substrate includes a pixel driving circuit electrically connected to each of the anode blocks; and the first pixel defining structure is lightproof, and the first pixel defining structure covers the pixel driving circuit.

Optionally, the pixel driving circuit includes at least one oxide transistor.

Optionally, the plurality of first pixel defining structures are arranged in parallel in a first direction, the plurality of second pixel defining structures are arranged in parallel in a second direction, and the first direction is perpendicular to the second direction.

Optionally, a width of the first pixel defining structure and a width of the second pixel defining structure both range from 0.5 micrometers to 3 micrometers.

In another aspect, a method for manufacturing a display panel is provided. The method includes: forming a pixel defining layer and a cathode layer on a substrate, where the pixel defining layer includes a plurality of strip-shaped first pixel defining structures and a plurality of strip-shaped second pixel defining structures, and the plurality of first pixel defining structures and the plurality of second pixel defining structures are configured to define a plurality of sub-pixel regions arranged in an array on the substrate; and a slope angle of the second pixel defining structure is greater than a slope angle of the first pixel defining structure, and the second pixel defining structure is configured to separate portions of the cathode layer on two sides of the second pixel defining structure.

In still another aspect, a display device is provided. The display device includes a power supply component and a display panel. The power supply component is configured to supply power to the display panel. The display panel includes: a substrate, and a pixel defining layer and a cathode layer that are laminated on the substrate, wherein the pixel defining layer includes a plurality of strip-shaped first pixel defining structures and a plurality of strip-shaped second pixel defining structures, and the plurality of first pixel defining structures and the plurality of second pixel defining structures are configured to define a plurality of sub-pixel regions arranged in an array on the substrate; and a slope angle of the second pixel defining structure is greater than a slope angle of the first pixel defining structure, and the second pixel defining structure is configured to separate portions of the cathode layer on two sides of the second pixel defining structure.

DETAILED DESCRIPTION

The present disclosure is described hereinafter in detail. Examples of the embodiments of the present disclosure are shown in the accompanying drawings. The same or similar numerals represent the same or similar parts or parts having the same or similar functions throughout the specification. In addition, if the detailed description of the prior art is unnecessary for illustrating the features of the present disclosure, the detailed description is omitted. The embodiments described below with reference to the accompanying drawings are exemplary, and are merely used to explain the present disclosure but should not be construed as limitations to the present disclosure.

Persons skilled in the art can understand that all terms (including technical terms and scientific terms) used herein have meanings same as those generally understood by persons of ordinary skill in the art of the present disclosure, unless otherwise defined. It should be further understood that terms such as those defined in general dictionaries should be understood to have meanings same as those in the context of the prior art, and are not deemed as having ideal or too formal meanings, unless specifically defined herein Persons skilled in the art can understand that the singular forms "a," "an," and "the" used herein are intended to include the plural forms as well, unless specifically stated. It should be further understood that the term "include" used in the description of the present disclosure refers to the presence of a feature, an integer, a step, an operation, an element and/or a component, but does not exclude the presence or addition of one or more other features, integers, steps, operations, elements, components and/or a combination thereof. It should be understood that the term "and/or" used herein encompasses all, any, or all possible combinations of one or more of the associated listed items.

Figure 1:
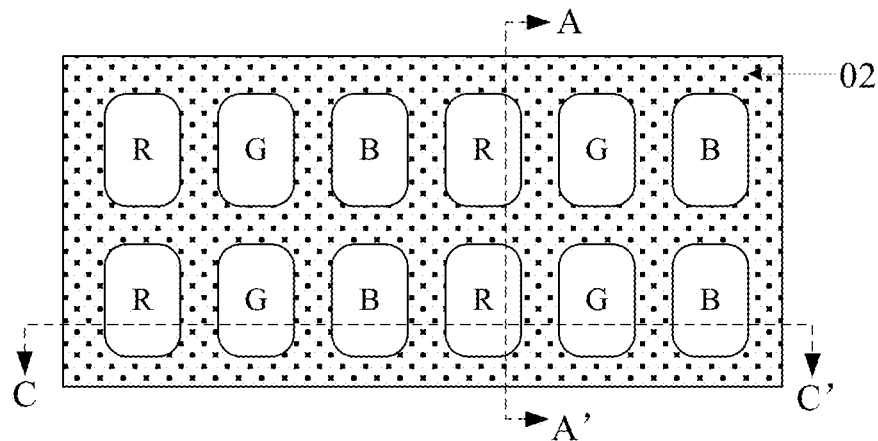
FIG. 1 is a top view of a common OLED display panel at present.

Referring to FIG. 1, which is a top view of a common OLED display panel at present, the OLED display panel may include a substrate 01 (the substrate 01 is not shown in FIG. 1) and a pixel defining layer 02 disposed on the substrate 01. The pixel defining layer 02 is configured to define a plurality of sub-pixel regions 011 on the substrate 01. Each sub-pixel region 011 is configured to accommodate one sub-pixel. For example, a red sub-pixel R, a green sub-pixel G, and a blue sub-pixel B in the OLED display panel may be respectively disposed in three sub-pixel regions adjacent in a row direction.

Each sub-pixel may include a pixel driving circuit disposed in the substrate 01 and a light-emitting device that is disposed in the sub-pixel region 011 and electrically connected to the pixel driving circuit. The light-emitting device may include an anode, a light-emitting layer, and a cathode that are laminated.

Figure 2:
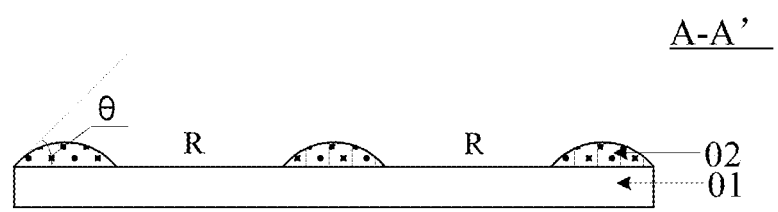
FIG. 2 is a schematic diagram of a film layer structure at A-A' of the OLED display panel shown in FIG. 1.
Figure 3:
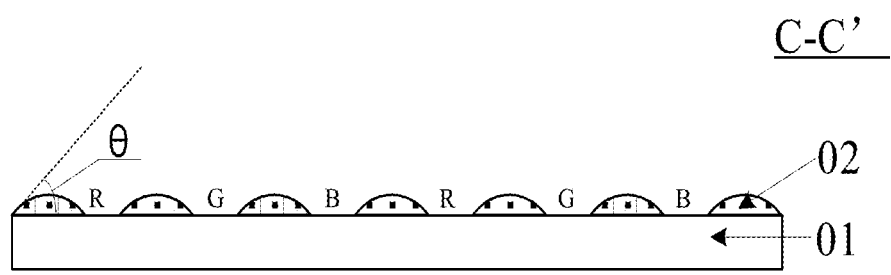
FIG. 3 is a schematic diagram of a film layer structure at C-C' of the OLED display panel shown in FIG. 1.

At present, a whole layer evaporation process is generally adopted in a process of manufacturing an OLED display panel, that is, an open mask is used to perform whole layer evaporation on the light-emitting layer and a cathode layer. As shown in FIG. 2 and FIG. 3, FIG. 2 is a schematic diagram of a film layer structure at A-A' of the OLED display panel shown in FIG. 1, and FIG. 3 is a schematic diagram of a film layer structure at C-C' of the OLED display panel shown in FIG. 1. Slope angles θ of the pixel defining layer 02 on the substrate 01 all range from 20 degrees to 60 degrees in all directions. Therefore, the light-emitting layer and the cathode layer formed through the whole layer evaporation are continuously distributed on the pixel defining layer 02.

In this case, when an anode signal is loaded to an anode in a sub-pixel, the anode signal loaded to the anode passes through the whole light-emitting layer and the whole cathode layer to spread to adjacent sub-pixels. As a result, a weak anode signal is loaded to the anodes in the adjacent sub-pixels, which causes the adjacent sub-pixels to emit weak light. That is, the phenomenon of light leakage occurs in the adjacent sub-pixels.

For example, assuming that the red sub-pixel R need to emit light, while the green sub-pixel G and the blue sub-pixel B adjacent to the red sub-pixel R do not need to emit light, then an anode signal needs to be loaded to the anode in the red sub-pixel R. The anode signal passes through the whole light-emitting layer and the whole cathode layer to spread to the adjacent green sub-pixel G and blue sub-pixel B. As a result, the green sub-pixel G emits weak green light, and the blue sub-pixel B emits weak blue light, which causes a color shift phenomenon in the OLED display panel. Thus, the display effect of the OLED display panel is severely affected.

Figure 4:
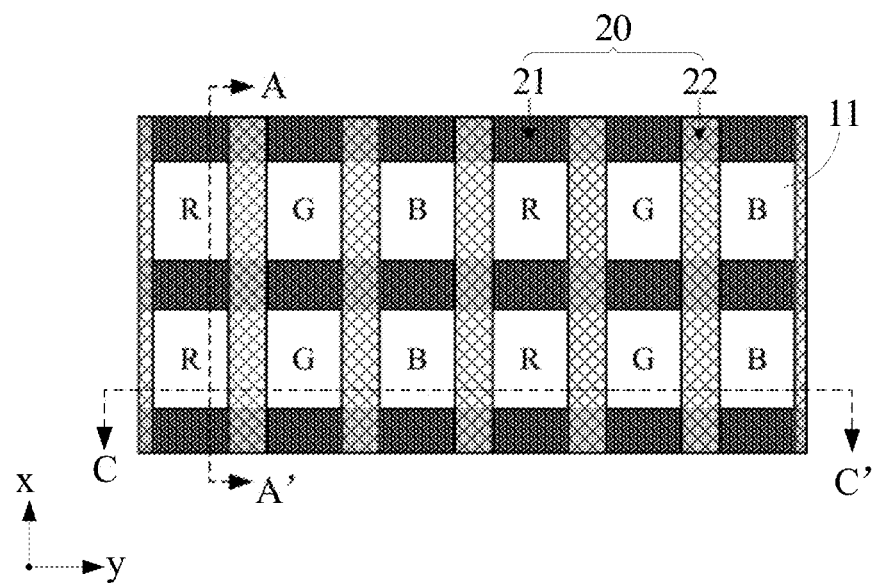
FIG. 4 is a top view of a display panel according to an embodiment of the present disclosure.

Referring to FIG. 4, FIG. 4 is a top view of a display panel according to an embodiment of the present disclosure. The display panel may include a substrate 10 (the substrate 10 is not shown in FIG. 4) as well as a pixel defining layer 20 and a cathode layer 30 (the cathode layer 30 is not shown in FIG. 4) that are laminated on the substrate 10.

The pixel defining layer 20 may include a plurality of strip-shaped first pixel defining structures 21 and a plurality of strip-shaped second pixel defining structures 22. The first pixel defining structures 21 and the second pixel defining structures 22 are arranged in a crossed fashion. That is, the length direction of the first pixel defining structure 21 intersects the length direction of the second pixel defining structure 22, such that the plurality of first pixel defining structures 21 and the plurality of second pixel defining structures 22 can define a plurality of sub-pixel regions 11 on the substrate 10. For example, any two adjacent first pixel defining structures 21 and any two adjacent second pixel defining structures 22 can enclose one sub-pixel region 11. Each sub-pixel region 11 is configured to accommodate one sub-pixel. In the present disclosure, the display panel may include sub-pixels of at least two colors. For example, the sub-pixels of at least two colors may be red sub-pixels R, green sub-pixels G, and blue sub-pixels B. Persons skilled in the art understands that the colors of the sub-pixels are not limited to red, green, and blue, and may further include other colors. Persons skilled in the art may select and arrange sub-pixels of different colors based on actual demands.

Figure 5:
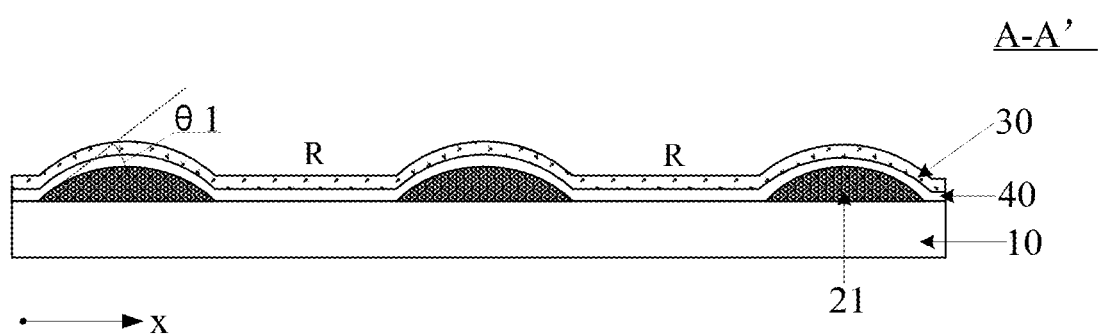
FIG. 5 is a schematic diagram of a film layer structure at A-A' of the display panel shown in FIG. 4.
Figure 6:
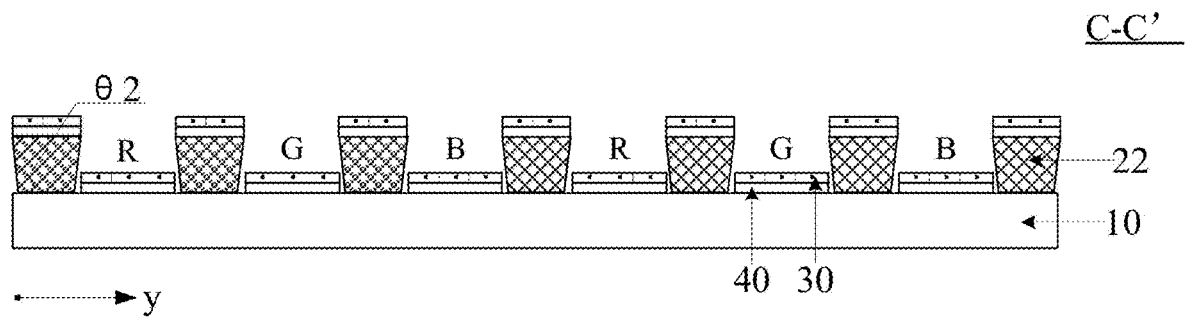
FIG. 6 is a schematic diagram of a film layer structure at C-C' of the display panel shown in FIG. 4.

As shown in FIG. 5 and FIG. 6, FIG. 5 is a schematic diagram of a film layer structure at A-A' of the display panel shown in FIG. 4, and FIG. 6 is a schematic diagram of a film layer structure at C-C' of the display panel shown in FIG. 4. The slope angle θ2 of the second pixel defining structure 22 is greater than the slope angle θ1 of the first pixel defining structure 21.

In the present disclosure, the slope angle θ2 of the second pixel defining structure 22 is relatively big, such that the second pixel defining structure 22 can separate the cathode layer 30. For example, when the cathode layer 30 is formed on the pixel defining layer 20 by an evaporation process, the second pixel defining structure 22 in the pixel defining layer 20 may separate portions of the cathode layer 30 on two sides of the second pixel defining structure 22. It should be noted that the sub-pixels in two adjacent sub-pixel regions 11 on the two sides of the second pixel defining structure 22 are of different colors.

In this case, it is assumed that an anode signal is loaded to the sub-pixel in a sub-pixel region. The portion of the cathode layer 30 in the sub-pixel region and the portion of the cathode layer 30 in an adjacent sub-pixel region are separated by the second pixel defining structure. Therefore, the anode signal does not spread through the cathode layer 30, so that the sub-pixel in the adjacent sub-pixel region is not lit.

In summary, the display panel provided in the embodiment of the present disclosure includes a substrate, as well as a pixel defining layer and a cathode layer that are disposed on the substrate. The slope angle of a second pixel defining structure is greater than the slope angle of a first pixel defining structure in the pixel defining layer. The slope angle of the second pixel defining structure is relatively big, such that the second pixel defining structure can separate the cathode layer. In this case, when an anode signal is loaded to a sub-pixel, the anode signal does not pass through the cathode layer to spread to an adjacent sub-pixel, so that the sub-pixel in the adjacent sub-pixel region is not lit, which reduces the probability of light leakage in an adjacent sub-pixel region. Thus, the probability that the color shift phenomenon occurs in the display panel is effectively reduced, thereby effectively improving the display effect of the display panel.

In the embodiment of the present disclosure, as shown in FIG. 4 to FIG. 6, the slope angle θ1 of the first pixel defining structure 21 is relatively small, and the first pixel defining structure 21 does not separate the cathode layer 30. In this case, the portion of the cathode layer 30 between two adjacent second pixel defining structures 22 is of a continuous strip-shaped structure. Thus, the portions of the cathode layer 30 in the sub-pixel regions 11 between two adjacent second pixel defining structures 22 are connected in series, such that the cathode signal provided by the cathode layer 30 can be loaded to the sub-pixels in the sub-pixel regions 11 simultaneously, which ensures that the cathode signal in the display panel can be normally transmitted.

In this case, the sub-pixels in two adjacent sub-pixel regions 11 on the two sides of the first pixel defining structure 21 are the same color. In this way, even if an anode signal is loaded to the sub-pixel in one of the two sub-pixel regions, the anode signal passes through the cathode layer 30 to spread to the sub-pixel in the other sub-pixel region to enable the sub-pixel in the other sub-pixel region to emit weak light, the display effect of the display panel is not affected.

In the embodiment of the present disclosure, the plurality of first pixel defining structures 21 in the pixel defining layer 20 are arranged in parallel in a first direction x, and the plurality of second pixel defining structures 22 in the pixel defining layer 20 are arranged in parallel in a second direction y. That is, the length direction of the first pixel defining structure 21 is parallel to the second direction y, and the length direction of the second pixel defining structure 22 is parallel to the first direction x. In the present disclosure, the first direction x is perpendicular to the second direction y.

In this case, the sub-pixels in sub-pixel regions between two adjacent second pixel defining structures 22 are of the same color. That is, one row of sub-pixels arranged in the first direction x are of the same color. The sub-pixels in any two adjacent sub-pixel regions between two adjacent first pixel defining structures 21 are of different colors. That is, any two adjacent sub-pixels in one row of sub-pixels arranged in the second direction y are of different colors.

In the embodiment of the present disclosure, as shown in FIG. 4 to FIG. 6, the display panel may further include a light-emitting layer 40 disposed between the pixel defining layer 20 and the cathode layer 30. In this case, the portion of the light-emitting layer 40 between two adjacent second pixel defining structures 22 is of a continuous strip-shaped structure. Thus, the portions of the light-emitting layer 40 in the sub-pixel regions 11 between two adjacent second pixel defining structures 22 are connected in series. The light-emitting layer 40 may be separated by the second pixel defining structure 22, or may be not separated by the second pixel defining structure 22. The following embodiment is illustrated by taking an example in which the light-emitting layer 40 is separated by the second pixel defining structure 22.

For example, when the light-emitting layer 40 is formed on the pixel defining layer 20 by an evaporation process, the second pixel defining structure 22 in the pixel defining layer 20 may separate portions of the light-emitting layer 40 on two sides of the second pixel defining structure 22. In this way, when an anode signal is loaded to a sub-pixel, the anode signal does not spread through the light-emitting layer 40, which reduces the probability of light leakage in a sub-pixel that is adjacent to the sub-pixel and has a color different from the color of the sub-pixel, thereby further improving the display effect of the display panel.

It should be noted that the light-emitting layer 40 in the embodiment of the present disclosure may be a first sub-light-emitting layer configured to emit red light, a second sub-light-emitting layer configured to emit green light, and a third sub-light-emitting layer configured to emit blue light that are laminated, such that the light-emitting layer 40 can emit white light under the joint action of the first sub-light-emitting layer, the second sub-light-emitting layer, and the third sub-light-emitting layer. In this case, the display panel may further include a color filter layer. The color filter layer may include a red filter, a green filter, and a blue filter. Each filter may be arranged in one sub-pixel region, such that the sub-pixels of different colors can emit light rays of corresponding colors.

Figure 7:
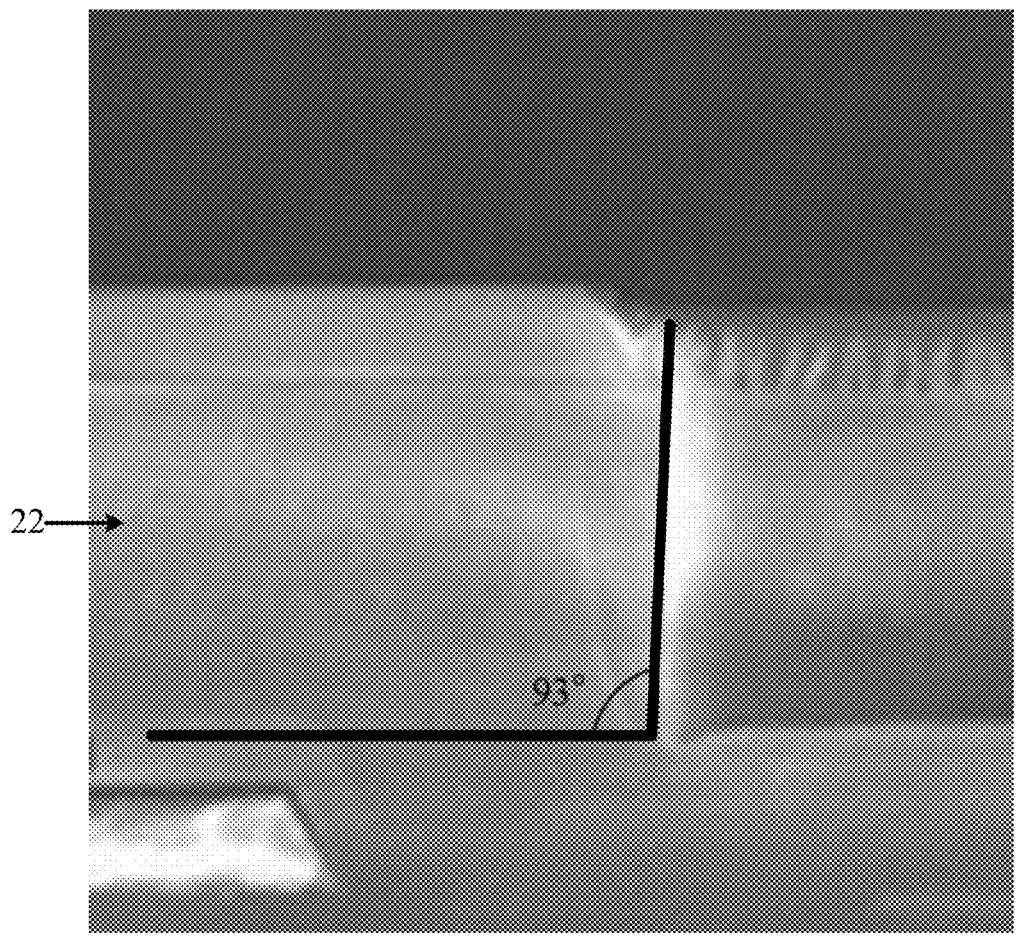
FIG. 7 is a scanning electron microscope image of a second pixel defining structure according to an embodiment of the present disclosure.

In the embodiment of the present disclosure, as shown in FIG. 6, to enable the second pixel defining structure 22 to separate the cathode layer 30, it should be ensured that the slope angle θ2 of the second pixel defining structure 22 is relatively big. For example, the slope angle θ2 of the second pixel defining structure 22 ranges from 90 degrees to 100 degrees. For example, as shown in FIG. 7, which is a scanning electron microscope image of a second pixel defining structure according to an embodiment of the present disclosure, the slope angle θ2 of the second pixel defining structure 22 is 93 degrees. It should be noted that the value of the slope angle θ2 of the second pixel defining structure 22 includes endpoint values of 90 degrees and 100 degrees.

Optionally, the shape of a cross section of the second pixel defining structure 22 may be at least one of an inverted trapezoid and an inverted circular trapezoid. The cross section of the second pixel defining structure 22 is perpendicular to the substrate 10, and is perpendicular to the length direction of the second pixel defining structure 22.

For example, the second pixel defining structure 22 may be a structure formed by performing a one-time patterning process on a non-photosensitive material. That is, a non-photosensitive material layer made of the non-photosensitive material may be first coated or deposited on the substrate 10, and then the one-time patterning process is performed on the non-photosensitive material layer, to obtain the second pixel defining structure 22. For example, the non-photosensitive material may include organic silicone resin. The one-time patterning process may include photoresist coating, exposure, development, etching, and photoresist stripping. In the process of etching the non-photosensitive material, the process of etching may be precisely controlled, to ensure that the slope angle of the non-photosensitive material after etching is within an angle range. Therefore, the slope angle θ2 of the second pixel defining structure 22 formed by performing the one-time patterning process on the non-photosensitive material may be an angle from 90 degrees to 100 degrees.

Figure 8:
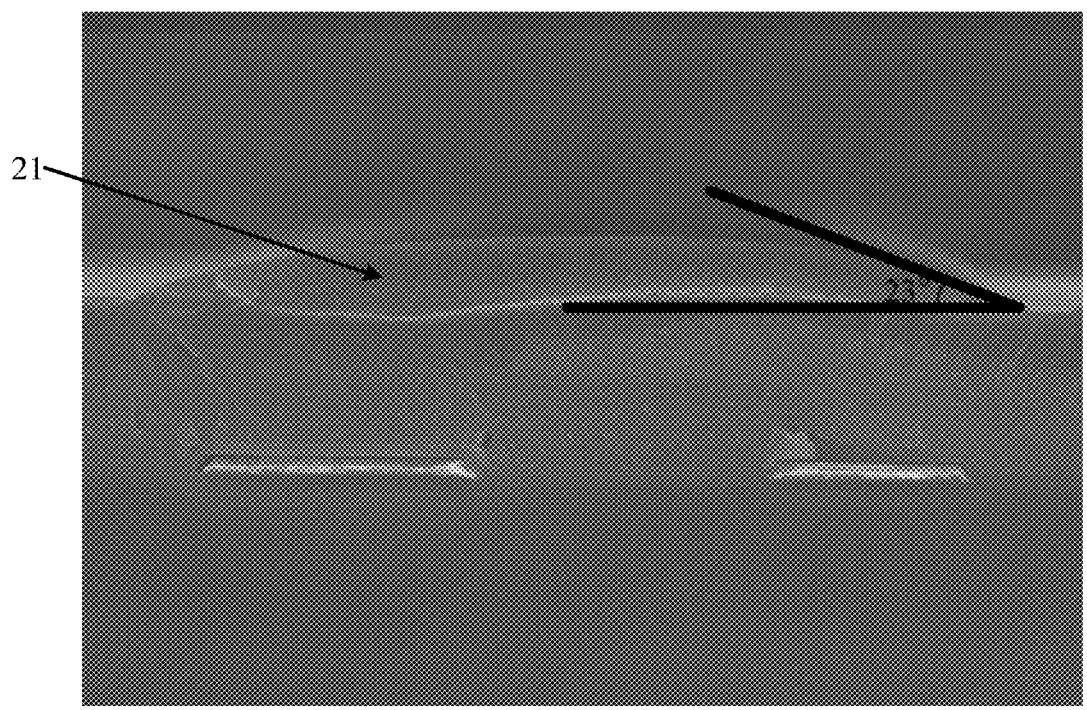
FIG. 8 is a scanning electron microscope image of a first pixel defining structure according to an embodiment of the present disclosure.

In the embodiment of the present disclosure, as shown in FIG. 5, to avoid the first pixel defining structure 21 from separating the cathode layer 30, it should be ensured that the slope angle θ1 of the first pixel defining structure 21 is relatively small. For example, the slope angle θ1 of the first pixel defining structure 21 ranges from 20 degrees to 60 degrees. A preferential range of the slope angle θ1 of the first pixel defining structure 21 is 20 degrees to 50 degrees. For example, as shown in FIG. 8, which is a scanning electron microscope image of a first pixel defining structure according to an embodiment of the present disclosure, the slope angle θ1 of the first pixel defining structure 21 is 23 degrees. It should be noted that the value of the slope angle θ1 of the first pixel defining structure 21 includes endpoint values of 20 degrees, 50 degrees, and 60 degrees.

Optionally, the shape of a cross section of the first pixel defining structure 21 may be a bow. The cross section of the first pixel defining structure 21 is perpendicular to the substrate 10, and is perpendicular to the length direction of the first pixel defining structure 21.

For example, the first pixel defining structure 21 may be a structure formed by performing exposure and development on a photosensitive material. That is, a photosensitive material layer made of the photosensitive material may be first coated or deposited on the substrate 10, and then a mask is used to perform exposure and development on the photosensitive material layer, to obtain the first pixel defining structure 21. For example, the photosensitive material includes at least one of an acrylic material or a polyimide material. After exposure and development are performed on the photosensitive material, the slope angle of the acquired photosensitive material is relatively small. Therefore, the slope angle θ1 of the first pixel defining structure 21 formed by performing exposure and development on the photosensitive material may be an angle between 20 degrees to 60 degrees.

Optionally, as shown in FIG. 5 and FIG. 6, the height of the first pixel defining structure 21 and the height of the second pixel defining structure 22 in the pixel defining layer 20 both range 0.5 micrometers to 3 micrometers. It should be noted that the height herein is the width of the first pixel defining structure 21 or the width of the second pixel defining structure 22 in the direction perpendicular to the substrate 10. It should further be noted that the values of the height of the first pixel defining structure 21 and the height of the second pixel defining structure 22 both include endpoint values of 0.5 micrometers and 3 micrometers.

Figure 9:
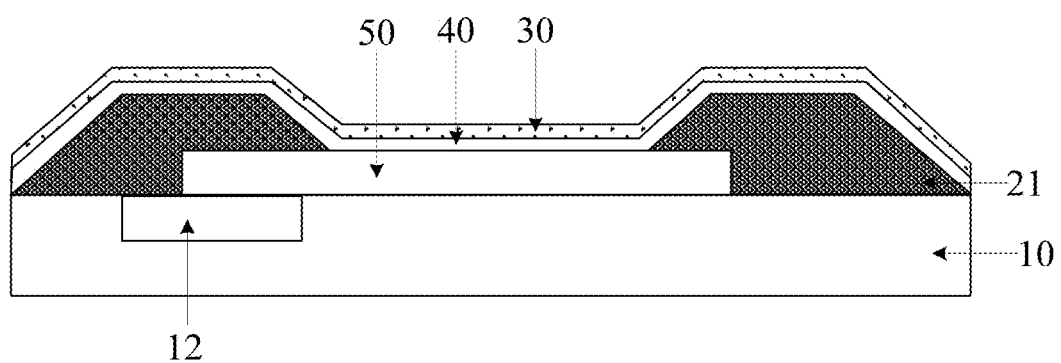
FIG. 9 is a schematic diagram of a film layer structure of a sub-pixel in a display panel according to an embodiment of the present disclosure.

In the embodiment of the present disclosure, as shown in FIG. 9, which is a schematic diagram of a film layer structure of a sub-pixel in a display panel according to an embodiment of the present disclosure, the display panel may further include a plurality of anode blocks 50 disposed between the pixel defining layer 20 and the substrate 10. The plurality of anode blocks 50 may be in one-to-one correspondence with the plurality of sub-pixel regions 11. The central part of each anode block 50 may be disposed in a corresponding sub-pixel region 11, and the edge part of each anode block 50 may be covered by the pixel defining layer 20. For example, the anode block 50, the light-emitting layer 40, and the cathode layer 30 that are laminated in each sub-pixel region 11 can form one light-emitting device. For example, the light-emitting device may be an OLED light-emitting device.

In the present disclosure, the substrate 10 may include a pixel driving circuit 12 electrically connected to each anode block 50. For example, each pixel driving circuit 12 may include at least one oxide transistor. It should be noted that each sub-pixel may include a pixel driving circuit 12 and a light-emitting device connected to the pixel driving circuit 12.

Optionally, the first pixel defining structure 21 in the pixel defining layer 20 is lightproof. For example, the first pixel defining structure 21 has a light transmittance of less than 10% for light rays with a wavelength greater than or equal to 550 nanometers. The first pixel defining structure 21 may cover the pixel driving circuit 12, such that the first pixel defining structure 21 may shield light for the pixel driving circuit 12, to avoid that the electrical performance of the oxide transistor is interfered by light rays after the light rays irradiate to the oxide transistor in the pixel driving circuit, thereby ensuring relatively high light-emitting stability of the display panel.

In summary, the display panel provided in the embodiment of the present disclosure includes a substrate, as well as a pixel defining layer and a cathode layer that are disposed on the substrate. The slope angle of a second pixel defining structure is greater than the slope angle of a first pixel defining structure in the pixel defining layer. The slope angle of the second pixel defining structure is relatively large, such that the second pixel defining structure can separate the cathode layer. Therefore, when an anode signal is loaded to a sub-pixel, the anode signal does not pass through the cathode layer to spread to an adjacent sub-pixel, so that the sub-pixel in the adjacent sub-pixel region is not lit, which reduces the probability of light leakage in the adjacent sub-pixel. Thus, the probability that color shift occurs in the display panel is effectively reduced, thereby effectively improving the display effect of the display panel.

An embodiment of the present disclosure further provides a method for manufacturing a display panel. The method for manufacturing a display panel is applied to manufacture the display panel shown in FIG. 4. The method may include: forming a pixel defining layer and a cathode layer on a substrate.

The pixel defining layer includes a plurality of strip-shaped first pixel defining structures and a plurality of strip-shaped second pixel defining structures, and the plurality of first pixel defining structures and the plurality of second pixel defining structures are configured to define a plurality of sub-pixel regions arranged in an array on the substrate. The slope angle of the second pixel defining structure is greater than the slope angle of the first pixel defining structure, and the second pixel defining structure is configured to separate portions of the cathode layer on two sides of the second pixel defining structure.

In summary, the method for manufacturing a display panel provided in the embodiment of the present disclosure includes: forming a pixel defining layer and a cathode layer on a substrate. The slope angle of a second pixel defining structure is greater than the slope angle of a first pixel defining structure in the pixel defining layer. The slope angle of the second pixel defining structure is relatively large, such that the second pixel defining structure can separate the cathode layer. Therefore, when an anode signal is loaded to a sub-pixel, the anode signal does not pass through the cathode layer to spread to an adjacent sub-pixel, so that the sub-pixel in the adjacent sub-pixel region is not lit, which reduces the probability of light leakage in the adjacent sub-pixel. Thus, the probability that color shift occurs in the display panel is effectively reduced, thereby effectively improving the display effect of the display panel.

Figure 10:
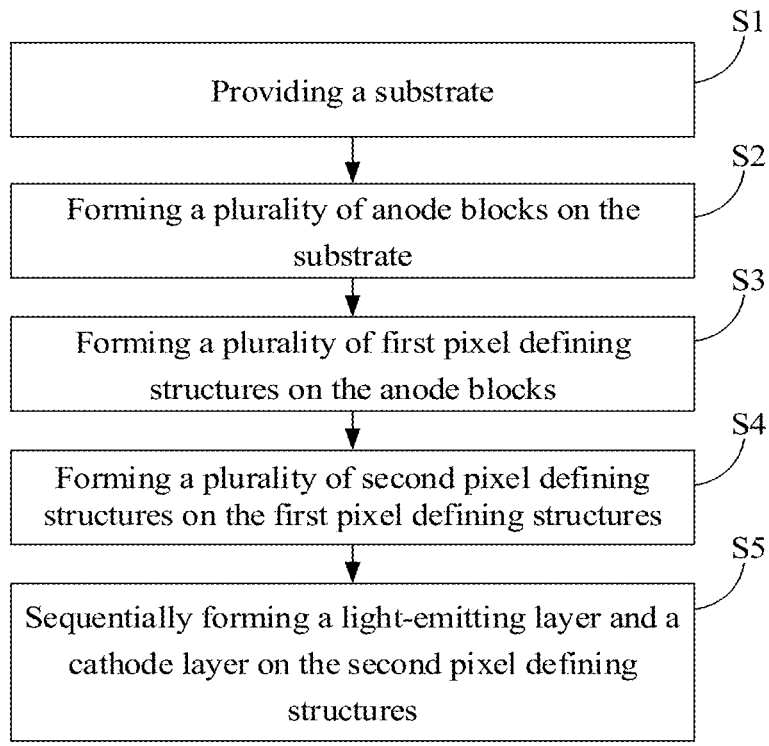
FIG. 10 is a flowchart of a method for manufacturing a display panel according to an embodiment of the present disclosure.

Referring to FIG. 10, which is a flowchart of a method for manufacturing a display panel according to an embodiment of the present disclosure, the method for manufacturing a display panel may include the following steps.

In step S1, a substrate is provided.

In the present disclosure, a plurality of pixel driving circuits arranged in an array are provided on the substrate. Each pixel driving circuit may include at least one oxide transistor.

In step S2, a plurality of anode blocks are formed on the substrate.

Figure 11:
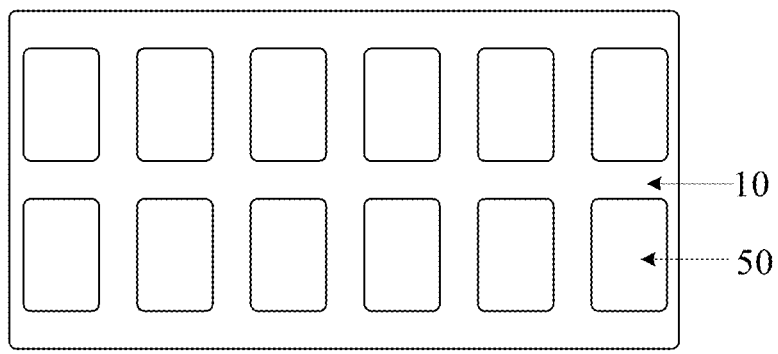
FIG. 11 is a schematic diagram of forming a plurality of anode blocks on a substrate according to an embodiment of the present disclosure.

In the present disclosure, the material of the anode block may be indium tin oxide (ITO). For example, as shown in FIG. 11, which is a schematic diagram of forming a plurality of anode blocks on a substrate according to an embodiment of the present disclosure, a whole conductive layer may be formed on the substrate 10, and then a one-time patterning process is performed on the conductive layer, to obtain a plurality of anode blocks 50. The plurality of anode blocks 50 are connected in one-to-one correspondence to the plurality of pixel driving circuits in the substrate 10. The one-time patterning process may include photoresist coating, exposure, development, etching, and photoresist stripping.

In step S3, a plurality of first pixel defining structures are formed on the anode blocks.

In the present disclosure, the first pixel defining structure may be strip-shaped, and the plurality of first pixel defining structures are arranged in parallel. The material of the first pixel defining structure may be a lightproof photosensitive material. For example, the photosensitive material includes at least one of an acrylic material or a polyimide material.

Figure 12:
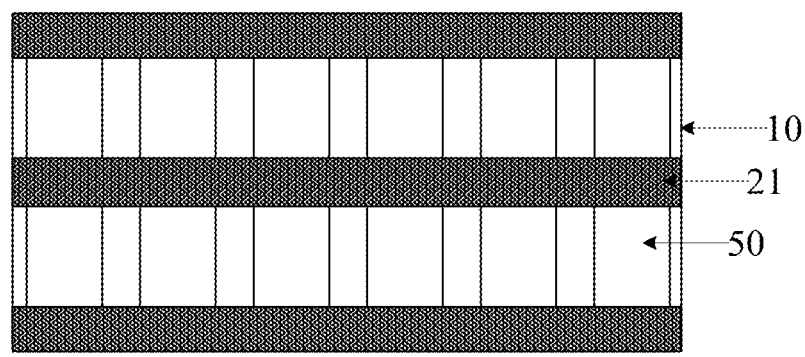
FIG. 12 is a schematic diagram of forming a plurality of first pixel defining structures on anode blocks according to an embodiment of the present disclosure.

For example, as shown in FIG. 12, FIG. 12 is a schematic diagram of forming a plurality of first pixel defining structures on anode blocks according to an embodiment of the present disclosure. First, the substrate formed with the plurality of anode blocks 50 may be cleaned. Next, a lightproof photosensitive material layer is coated on the substrate 10 formed with the plurality of anode blocks 50, and the substrate 10 is pre-baked. Then, a mask is adopted to perform exposure and development on the photosensitive material layer, to obtain a patterned photosensitive material layer. Finally, the patterned photosensitive material layer is post-baked, to obtain a plurality of first pixel defining structures 21. The slope angle of the first pixel defining structure 21 ranges from 20 degrees to 60 degrees, and the plurality of first pixel defining structures 21 may cover the pixel driving circuits in the substrate 10.

In step S4, a plurality of second pixel defining structures are formed on the first pixel defining structures.

In the present disclosure, the second pixel defining structure may be strip-shaped, and the plurality of second pixel defining structures are arranged in parallel. The length direction of the second pixel defining structure is perpendicular to the length direction of the first pixel defining structure. The material of the second pixel defining structure may be a non-photosensitive material. For example, the non-photosensitive material may include organic silicone resin.

Figure 13:
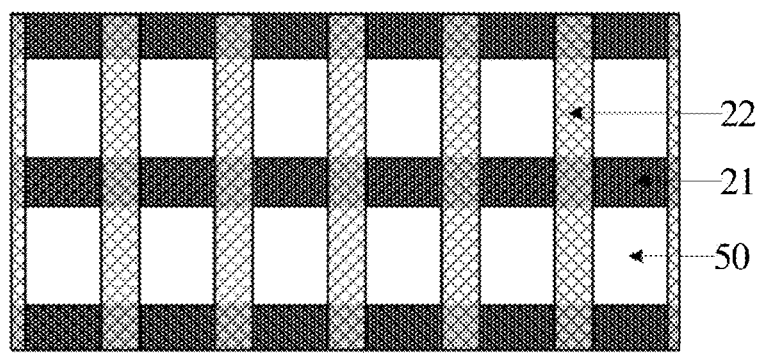
FIG. 13 is a schematic diagram of forming a plurality of second pixel defining structures on first pixel defining structures according to an embodiment of the present disclosure.

For example, as shown in FIG. 13, FIG. 13 is a schematic diagram of forming a plurality of second pixel defining structures on the first pixel defining structures according to an embodiment of the present disclosure. First, a non-photosensitive material layer may be coated on the substrate 10 formed with the plurality of first pixel defining structures 21, and the substrate 10 is dried. Next, a layer of photoresist is coated on the non-photosensitive material layer, and a mask is adopted to perform exposure and development on the photoresist, to obtain a photoresist pattern. Then, a gas mixture of sulfur hexafluoride and oxygen is adopted to perform dry etching on the non-photosensitive material layer that is not protected by the photoresist pattern. Finally, the photoresist pattern is stripped, to obtain a plurality of second pixel defining structures 22. The slope angle of the second pixel defining structure 22 ranges from 90 degrees to 100 degrees.

In step S5, a light-emitting layer and a cathode layer are sequentially formed on the second pixel defining structures.

In the embodiment of the present disclosure, the light-emitting layer and the cathode layer may be sequentially formed by an evaporation process on the substrate formed with the second pixel defining structures.

Persons skilled in the art that can clearly understand that for the convenience and conciseness of description, for the working principles of the structures in the display panel described above, reference may be made to the corresponding content in the foregoing embodiments of the structure of the display panel, and details are not described herein again.

In summary, the method for manufacturing a display panel provided in this embodiment of the present disclosure includes: forming a pixel defining layer and a cathode layer on a substrate. The slope angle of a second pixel defining structure is greater than the slope angle of a first pixel defining structure in the pixel defining layer. The slope angle of the second pixel defining structure is relatively large, such that the second pixel defining structure can separate the cathode layer. Therefore, when an anode signal is loaded to a sub-pixel, the anode signal does not pass through the cathode layer to spread to an adjacent sub-pixel, so that the sub-pixel in the adjacent sub-pixel region is not lit, which reduces the probability of light leakage in the adjacent sub-pixel. Thus, the probability that color shift occurs in the display panel is effectively reduced, thereby effectively improving the display effect of the display panel.

An embodiment of the present disclosure provides a display device. The display device may include a power supply component and a display panel. The power supply component is configured to supply power to the display panel. The display panel may be the display panel in the foregoing embodiments, and may be, for example, the display panel shown in FIG. 4. The display device may be a piece of electronic paper, a mobile phone, a tablet computer, a television, a display, a notebook computer, a digital frame, a navigator or any other product or component having a display function.

It should be noted that in the accompanying drawings, the size of the layers and regions may be exaggerated for clearer illustration. In addition, it is to be understood that when an element or a layer is described as being "on" another element or layer, the element or layer may be directly on another element or layer, or there may be an intermediate layer. In addition, it is to be understood that when an element or a layer is described as being "under" another element or layer, the element or layer may be directly under another element or layer, or there may be more than one intermediate layer or element. In addition, it is to be further understood that when a layer or an element is described as being "between" two layers or elements, the layer or element may be the only one layer between the two layers or elements, or there may be more than one intermediate layer or element. Similar reference numerals indicate similar elements throughout the specification.

In the present disclosure, the terms "first" and "second" are merely intended for description, but are not intended to indicate or imply relative importance. The term "a plurality of" refers to two or more than two, unless otherwise clearly specified.

Described above are merely optional embodiments of the present disclosure, but are not intended to limit the present disclosure. Any modifications, equivalent replacements, improvements and the like made within the spirit and principles of the present disclosure shall be included within the scope of protection of the present disclosure.

What is claimed is:

1. A display panel, comprising a substrate, as well as a pixel defining layer and a cathode layer that are laminated on the substrate,
   wherein the pixel defining layer comprises a plurality of strip-shaped first pixel defining structures and a plurality of strip-shaped second pixel defining structures, the plurality of first pixel defining structures and the plurality of second pixel defining structures are arranged in a crossed fashion to define a plurality of sub-pixel regions arranged in an array on the substrate, any adjacent first pixel defining structures and any adjacent second pixel defining structures enclosing one sub-pixel region; and
   wherein a slope angle of the second pixel defining structure is greater than a slope angle of the first pixel defining structure, and the second pixel defining structure is configured to separate portions of the cathode layer on two sides of the second pixel defining structure; a portion of the cathode layer between adjacent second pixel defining structures is of a continuous strip-shaped structure;
   the display panel further comprises sub-pixels of at least two colors,
   wherein the sub-pixels in sub-pixel regions between adjacent second pixel defining structures are of the same color, and the sub-pixels in any adjacent sub-pixel regions between adjacent first pixel defining structures are of different colors;
   the display panel further comprises:
      a plurality of anode blocks disposed between the pixel defining layer and the substrate, wherein the plurality of anode blocks are in one-to-one correspondence with the plurality of sub-pixel regions, for each of the anode blocks, a central part of the anode block is disposed in a sub-pixel region corresponding to the anode block, and in a direction perpendicular to the substrate, the pixel defining layer directly contacts and covers an edge part of the anode block; and
      a pixel driving circuit disposed within the substrate and electrically connected to each of the anode blocks, wherein the pixel driving circuit comprises at least one oxide transistor, and the first pixel defining structure is lightproof and covers the pixel driving circuit, to avoid light rays from irradiating to the at least one oxide transistor in the pixel driving circuit;
   the slope angle of the first pixel defining structure ranges from 20 degrees to 60 degrees, and the slope angle of the second pixel defining structure ranges from 90 degrees to 100 degrees.

2. The display panel according to claim 1, wherein a shape of a cross section of the second pixel defining structure is at least one of an inverted trapezoid and an inverted circular trapezoid.

3. The display panel according to claim 1, wherein the second pixel defining structure is made of a non-photosensitive material.

4. The display panel according to claim 3, wherein the non-photosensitive material comprises organic silicone resin.

5. The display panel according to claim 1, wherein a shape of a cross section of the first pixel defining structure is a bow.

6. The display panel according to claim 1, wherein the first pixel defining structure is made of a photosensitive material.

7. The display panel according to claim 6, wherein the photosensitive material comprises at least one of an acrylic material or a polyimide material.

8. The display panel according to claim 1, further comprising: a light-emitting layer disposed between the pixel defining layer and the cathode layer, and the second pixel defining structure is further configured to separate portions of the light-emitting layer on two sides of the second pixel defining structure.

9. The display panel according to claim 8, wherein a portion of the light-emitting layer between adjacent second pixel defining structures is of a continuous strip-shaped structure.

10. The display panel according to claim 1, wherein the plurality of first pixel defining structures are arranged in parallel in a first direction, the plurality of second pixel defining structures are arranged in parallel in a second direction, and the first direction is perpendicular to the second direction.

11. The display panel according to claim 1, wherein a width of the first pixel defining structure and a width of the second pixel defining structure both range from 0.5 micrometers to 3 micrometers.

12. A display device, comprising a power supply component and a display panel, wherein the power supply component is configured to supply power to the display panel, and the display panel comprises:
    a substrate, and a pixel defining layer and a cathode layer that are laminated on the substrate,
    wherein the pixel defining layer comprises a plurality of strip-shaped first pixel defining structures and a plurality of strip-shaped second pixel defining structures, the plurality of first pixel defining structures and the plurality of second pixel defining structures are arranged in a crossed fashion to define a plurality of sub-pixel regions arranged in an array on the substrate, any adjacent first pixel defining structures and any adjacent second pixel defining structures enclosing one sub-pixel region; and
    wherein a slope angle of the second pixel defining structure is greater than a slope angle of the first pixel defining structure, and the second pixel defining structure is configured to separate portions of the cathode layer on two sides of the second pixel defining structure; a portion of the cathode layer between adjacent second pixel defining structures is of a continuous strip-shaped structure;
the display panel further comprises sub-pixels of at least two colors,
wherein the sub-pixels in sub-pixel regions between adjacent second pixel defining structures are of the same color, and the sub-pixels in any adjacent sub-pixel regions between adjacent first pixel defining structures are of different colors;
the display panel further comprises:
    a plurality of anode blocks disposed between the pixel defining layer and the substrate, wherein the plurality of anode blocks are in one-to-one correspondence with the plurality of sub-pixel regions, for each of the anode blocks, a central part of the anode block is disposed in a sub-pixel region corresponding to the anode block, and in a direction perpendicular to the substrate, the pixel defining layer directly contacts and covers an edge part of the anode block; and
    a pixel driving circuit disposed within the substrate and electrically connected to each of the anode blocks, wherein the pixel driving circuit comprises at least one oxide transistor, and the first pixel defining structure is lightproof and covers the pixel driving circuit, to avoid light rays from irradiating to the at least one oxide transistor in the pixel driving circuit;
the slope angle of the first pixel defining structure ranges from 20 degrees to 60 degrees, and the slope angle of the second pixel defining structure ranges from 90 degrees to 100 degrees.

* * * * *